(12) United States Patent
Huang et al.

(10) Patent No.: US 7,477,055 B1
(45) Date of Patent: Jan. 13, 2009

(54) APPARATUS AND METHOD FOR COUPLING COILS IN A SUPERCONDUCTING MAGNET

(75) Inventors: Xianrui Huang, Clifton Park, NY (US); Paul S. Thompson, Stephentown, NY (US); Minfeng Xu, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/842,694

(22) Filed: Aug. 21, 2007

(51) Int. Cl.
*G01V 3/00* (2006.01)
(52) U.S. Cl. ........................... 324/318; 324/319
(58) Field of Classification Search ......... 324/300–322; 335/216
See application file for complete search history.

(56) References Cited

U.S. PATENT DOCUMENTS

| | | | |
|---|---|---|---|
| 3,007,057 A * | 10/1961 | Brennemann et al. | 327/373 |
| 5,731,939 A * | 3/1998 | Gross et al. | 361/19 |
| 6,783,059 B2 | 8/2004 | Laskaris et al. | |
| 6,995,562 B2 * | 2/2006 | Laskaris et al. | 324/318 |
| 7,260,941 B2 * | 8/2007 | van Hasselt | 62/6 |
| 7,319,329 B2 * | 1/2008 | Huang et al. | 324/319 |
| 7,352,183 B2 * | 4/2008 | Huang | 324/318 |
| 2008/0084207 A1 * | 4/2008 | Frantz et al. | 324/307 |

* cited by examiner

*Primary Examiner*—Brij B Shrivastav
(74) *Attorney, Agent, or Firm*—Jason K. Klindtworth

(57) ABSTRACT

A system and method for connecting superconducting magnet coils made up of coil segments to allow an integrated winding concept. The integrated winding concept can include serially connecting coil segments of coil pairs in an alternating pattern, which causes coil pairs to be electrically symmetric. Symmetric coil pairs can eliminate or significantly reduce the currents in magnet coils induced by gradient or other pulses, produce a homogenous field, and reduce the accumulated voltages in the coils due to gradient pulsing.

20 Claims, 3 Drawing Sheets

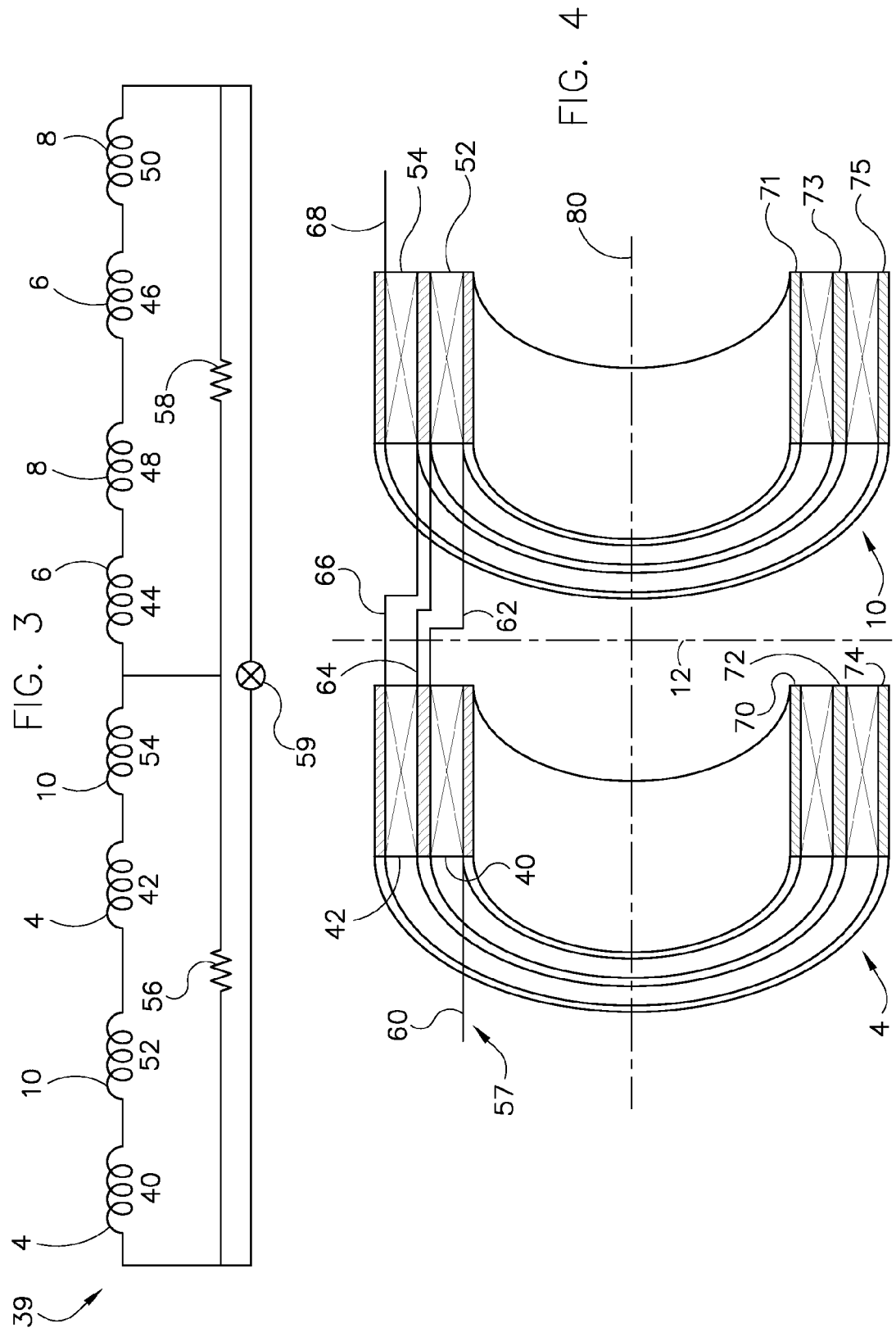

US 7,477,055 B1

APPARATUS AND METHOD FOR COUPLING COILS IN A SUPERCONDUCTING MAGNET

BACKGROUND OF THE INVENTION

The invention relates generally to superconducting magnet systems and, more particularly, to an integrated coil winding concept within a superconducting magnet system.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In one example, an MR system comprises a superconducting magnet, a magnet coil support structure, and a helium vessel. Liquid helium contained in the helium vessel provides cooling for the superconducting magnet and maintains the superconducting magnet at a low temperature for superconducting operations, as will be understood by those skilled in the art. The liquid helium maintains the superconducting magnet approximately and/or substantially at the liquid helium temperature of 4.2 Kelvin (K). For thermal isolation, in one example, the helium vessel that contains the liquid helium comprises a pressure vessel inside a vacuum vessel.

An MR superconducting magnet typically includes several coils, a set of primary coils that produce a uniform B0 field at the imaging volume, and a set of bucking coils that limit the fringe field of the magnet. These coils are wound with superconductors such as NbTi or Nb3Sn conductors. The magnet is cooled down to liquid helium temperature (4.2 K) so that the conductors are operated at their superconducting state. The heat loads of the magnet, such as that produced by the radiation and conduction from the environment, are removed by either the boil-off of liquid helium in an "open system" or by a 4 K cryocooler in a "closed system". The magnet is typically placed in a cryostat to minimize its heat loads since the replacement of liquid helium is expensive and since the cooling power of a cryocooler is limited.

When the several coils of the superconducting magnet are not physically symmetric about a mid-plane axis, field homogeneity can suffer. Furthermore, electrically coupling coil pairs unsymmetrically about the mid-plane axis can cause a net magnetic flux coupling, F, with the z-gradient coil, especially if the z-gradient coil is not fully shielded or it is unshielded. A z-gradient pulse can generate electromotive forces in each turn of the magnet coils (e=−dΦ/dt). The electromotive forces can accumulate in the magnet coils, which can result in induced currents or induced voltages in the coils, depending on the magnet coil circuit. The induced current would negatively affect the homogeneity and stability of the B0 field in the imaging volume. The induced voltage can damage the coil insulation and may induce partial discharges (PD) as well. The partial discharges can cause insulation aging and negatively affect the imaging quality.

It would therefore be desirable to have an apparatus and method capable of providing magnetic field homogeneity, avoiding induced currents and voltages, and ensuring the electric insulation of the magnet coils under gradient pulses.

BRIEF DESCRIPTION OF THE INVENTION

The present invention provides an apparatus and method of coupling coils of a superconducting magnet that overcome the aforementioned drawbacks. Coils of a superconducting magnet can be made up of coil segments to allow an integrated winding concept. The integrated winding concept can include serially connecting coil segments of coil pairs in an alternating pattern, and it can result in electrically symmetric coil pairs. Symmetric coil pairs can eliminate or significantly reduce the currents in magnet coils induced by gradient or other pulses, produce a homogenous field, and reduce the accumulated voltages in the coils due to gradient pulsing.

According to an aspect of the invention, a superconducting magnet includes a first superconducting magnet coil having a first pair of coil segments and a second superconducting magnet coil having a second pair of coil segments. The coil segments of the first and second pairs of coil segments are serially coupled together in a pattern alternating between the first and second superconducting magnet coils.

In accordance with another aspect of the invention, a magnetic resonance imaging (MRI) apparatus includes an MRI system having a plurality of gradient coils positioned about a bore of a superconducting magnet to impress a polarizing magnetic field and an RF transceiver system and an RF switch controlled by a pulse module to transmit RF signals to an RF coil assembly to acquire MR images. The superconducting magnet includes a first superconducting magnet coil with a first coil segment and a third coil segment, and a second superconducting magnet coil with a second and fourth coil segment. The coil segments of the first and second superconducting magnet coils are serially coupled together in a pattern alternating between the first and second superconducting magnet coils.

According to a further aspect of the present invention, a method of configuring superconducting magnets that includes concentrically positioning a first superconducting magnet coil, having first and third coil segments, on the same axis as a second superconducting magnet coil having second and forth coil segments. Also, the method includes serially coupling the first coil segment to the second coil segment, serially coupling the second coil segment to the third coil segment, serially coupling the third coil segment to the fourth coil segment, and serially coupling the fourth coil segment to one of the first coil segment or a coil segment of another coil.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 3 is a circuit schematic diagram of the superconducting magnet coils of FIG. 1 in a superconducting circuit according to an embodiment of the present invention.

FIG. 4 is a schematic diagram showing an integrated wiring of a pair of coils of the superconducting magnet of FIG. 1.

DETAILED DESCRIPTION OF THE PREFERRED EMBODIMENT

As will be described in greater detail below, embodiments of the present invention are directed to a symmetric coil grouping, an integrated coil winding concept, and a coil insulation design. The physically and electrically symmetric grouping of coils in the magnet circuit eliminates or significantly reduces the induced currents in the magnet coils by gradient or other pulses and produces a homogenous field. The integrated winding concept reduces the accumulated voltages in the coils due to gradient pulsing. Additionally, insulation layers are added between the coil segments in the integratedly wound coils to ensure coil insulation integrity. Embodiments of this invention are particularly useful if the gradient is not fully shielded and the magnetic interaction between the gradient coil and the magnet coils is strong, but are not limited thereto?*.

Figure 1:
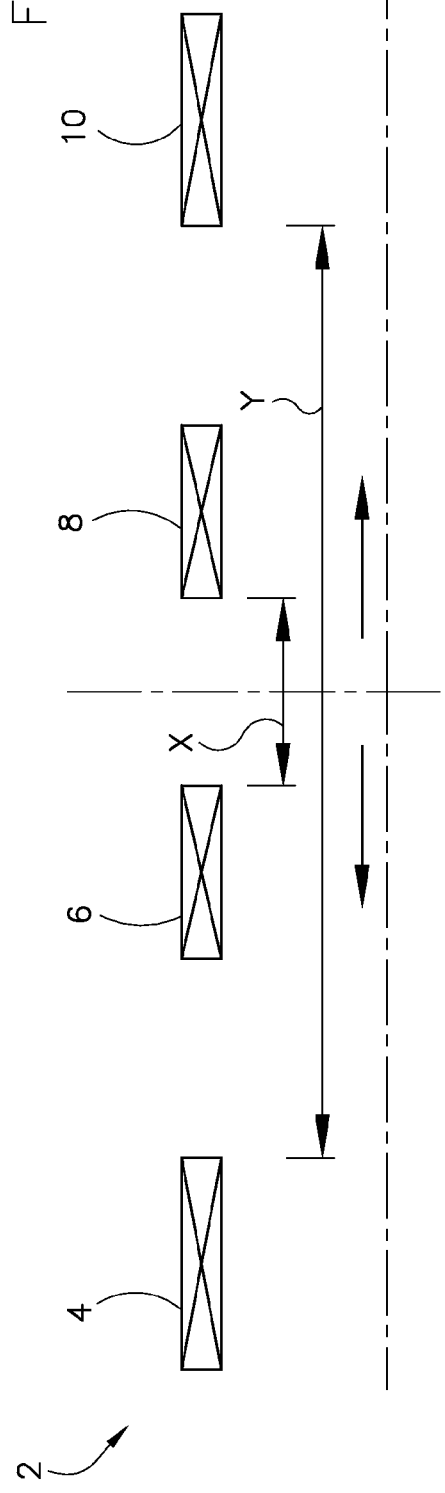
FIG. 1 is a schematic diagram showing a superconducting magnet according to an embodiment of the present convention.

Referring to FIG. 1, in order to provide a homogenous magnetic field, a magnet coil 2 is divided into a plurality of magnet coils 4, 6, 8, and 10. While FIG. 1 shows four magnet coils 4, 6, 8, and 10, it is contemplated that magnet coil 2 may include a different number of coils than that shown. Magnet coil 2 includes two pairs of superconducting magnet coils: a first pair of superconducting magnet coils 4 and 10 and a second pair of superconducting magnet coils 6 and 8. Coils 4, 10 and coils 6, 8, respectively, are equally spaced from a mid-plane axis 12. That is, coils 4 and 10 are substantially physically symmetric with respect to the mid-plane axis 12 located therebetween, and coils 6 and 8 are substantially physically symmetric with respect to the mid-plane 12 located therebetween. However, coils 6 and 8 are located a distance X from mid-plane axis 12, which is distinct from a distance Y that coils 4 and 10 are located from the mid-plane axis 12.

Figure 2:
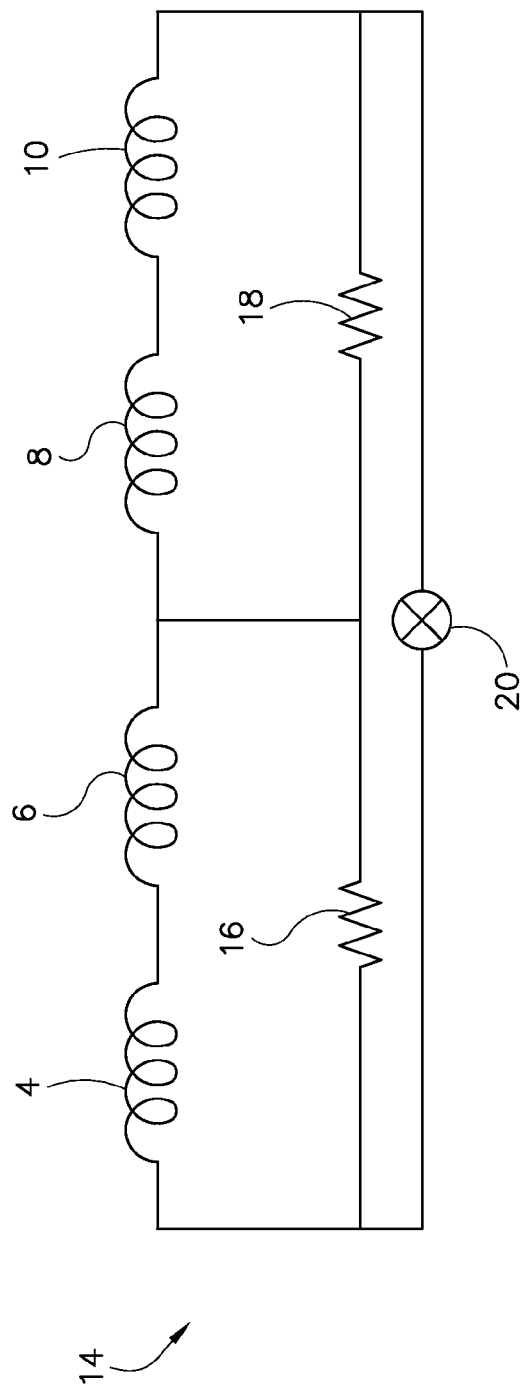
FIG. 2 is a prior art circuit schematic diagram of coils of the superconducting magnet of FIG. 1 in a superconducting circuit.

Referring to FIG. 2, a prior art circuit schematic diagram is depicted for coils 4, 6, 8, and 10. As shown, a superconducting loop 14 includes coils 4, 6, 8, and 10 that are serially coupled together such that coil 6 is serially connected between coils 4 and 8 and such that coil 8 is serially connected between coils 6 and 10. Coils 4 and 10 are serially connected together via a superconducting switch 20. Accordingly, coils 4, 6, 8, and 10 are serially connected to physically nearest neighbors rather than to electrically symmetric neighbors. Although this physically symmetric coil arrangement can aid in magnetic field homogeneity, when coils pairs are electrically unsymmetric, as shown in FIG. 2, they can have a net magnetic flux coupling, F, with a z-gradient coil of, for example, an MR imaging system, especially if the z-gradient coil is not fully shielded or it is unshielded. A z-gradient pulse can generate electromotive forces in each turn of the magnet coils ($e=-d\Phi/dt$). The electromotive forces can accumulate in the coils 4, 6, 8, and 10, which can result in induced currents or induced voltages in the coils 4, 6, 8, and 10, depending on the magnet coil circuit. In systems with electrically unsymmetric coil pairs, gradient pulses can induce currents in the current loops. The induced current can negatively affect the homogeneity and stability of the B0 field in the imaging volume. The field instability occurs as the induced currents decay over time, while the field inhomogeneity occurs because different coils can have different induced current. The induced voltage can damage coil insulation and may induce partial discharges (PD) as well. The partial discharges can cause insulation aging and negatively affect the imaging quality.

FIG. 2 also shows a resistive shunt 16 connected in parallel with coils 4 and 6 and a resistive shunt 18 connected in parallel with coils 8 and 10. Resistive shunts are often needed to protect the magnet in a magnet quench, which can occur when a portion of the magnet loses its superconductivity. The shunts 16, 18 enable faster current ramp-down and reduce the terminal voltages during a quench, but they can also provide current loops for the coils 4, 6, 8, and 10.

To maintain the desired homogeneity that can result from physically symmetric coil pairs 4, 10 and 6, 8 as shown in FIG. 1, the coil pairs 4, 10 and 6, 8 may be connected in an electrically symmetric pattern. The electrically symmetric grouping of the coils 4, 6, 8, and 10 forces each pair of the coils 4, 10 and 6, 8 to have the same current. The electrically symmetric grouping causes the gradient pulses to produce equal and opposite electromotive forces in the coils of each pair 4, 10 and 6, 8. The equal and opposite electromotive forces result in zero net electromotive force in the group, thus eliminating the induced currents. The elimination of induced currents in the magnet circuit improves magnetic field stability and homogeneity for imaging quality. In one embodiment of the invention, to connect coil pairs 4, 10 and 6, 8 in an electrically symmetric pattern, physically symmetric coil pairs 4, 10 and 6, 8 are connected using the integrated winding technique shown in FIGS. 3 and 4 and described below. The integrated winding of each pair of magnet coils 4, 10 and 6, 8 reduces the accumulated voltages in the coils 4, 6, 8, and 10 due to gradient pulsing because the coils' electromotive forces are in opposite directions.

Referring to FIG. 3, a circuit schematic diagram is shown of segments of coils 4, 6, 8, and 10 of FIG. 1 coupled together in a superconducting circuit 39 according to an integrated winding concept of an embodiment of the present invention. As shown in FIG. 1, coils 4 and 10 form a first symmetric grouping of magnet coils about mid-plane axis 12, and coils 6 and 8 form a second symmetric grouping of magnet coils about mid-plane axis 12. As shown in FIG. 3, coils 4, 10 of the first symmetric grouping are serially coupled together, and coils 6, 8 of the second symmetric grouping are serially coupled together. In addition, according to an embodiment of the present invention, each coil 4, 6, 8, and 10, includes a plurality of coils segments 40,42, 44,46, 48,50, and 52,54, respectively. The coil segments 40,42 and 52,54 of coils 4, 10, respectively, are serially coupled in an alternating pattern. The alternating pattern includes coil segment 40 serially coupled to coil segment 52, coil segment 52 serially coupled to coil segment 42, and coil segment 42 serially coupled to coil segment 54. Coil segment 54 of the first symmetric grouping of coils is serially coupled to coil segment 44 of the second symmetric grouping of coils. The alternating pattern also includes coil segment 44 serially coupled to 48, which is serially coupled to 46. Coil segment 46 is then serially coupled to coil segment 50, which is serially coupled back to coil segment 40 of the first symmetric grouping of coils through a superconducting switch 59. Also depicted in FIG. 3 are two resistive shunts 56, 58, which are each coupled in parallel to a respective symmetric grouping of coils 4, 6, 8, and 10.

FIG. 4 shows a cross-section of coils 4, 10 of the first symmetric grouping of coils illustrating the integrated winding concept according to an embodiment of the present invention. In one embodiment, coils 4 and 10 are concentrically located about axis 80 and are an equal distance away from the mid-plane axis 12. A superconducting wire 57 forms an electrically conductive path that is wound to form coil segments 40, 42, 52, and 54. Inside coil segments 40, 52 are serially wound followed by serial winding of outside coil segments 42, 54. Coil segments 40, 42, 52, and 54 are wound onto and between layers of insulation 70-75, which may be formed of polyimide polymer film, such as Kapton tape, or other like insulation materials, to ensure coil insulation integrity. The integrated winding concept according to this embodiment is executed so that coils 4 and 10 have the same dimensions and Ampere-turns.

Winding of coils 4, 10 and integration of insulation layers 70-75 according to an embodiment of the present invention includes placing inside insulation layers 70, 71 on a winding bobbin (not shown). Then, beginning with a portion 60 of wire routing 57, coil segment 40 is wound onto inside insulation layer 70 followed by winding coil segment 52 onto inside insulation layer 71 with a portion 62 of wire 57 extending therebetween. Following the winding of coil segments 40, 52, middle insulation layers 72, 73 are positioned to separate coil segments 40, 52 from additional coils segments to be wound. A portion 64 of wire routing 57 extends from coil segment 52 such that coil segment 42 may be wound on middle insulation layer 72. A portion 66 of wire routing 57 extends from wound coil segment 42, and coil segment 54 is then wound on middle insulation layer 73. Following the winding of coil segments 42, 54, outside insulation layers 74, 75 are positioned, respectively, thereon for isolation. Generally, the coil segments 40, 42, 44, 46, 48, 50, 52, and 54 are wound in the same direction such that the magnetic fields therefrom add to each other. However, it is also contemplated that alternate winding direction schemes can be used.

If coils 4 and 10 are the only pair of coils present in the superconducting magnet system, after being wound about segment 54, a portion 68 wire routing 57 is connected back to coil segment 40 by electrically connecting portion 68 with portion 60 through a superconducting switch. It is contemplated, however, that more than a single symmetric grouping of coils may be present in the superconducting magnet system as described above and as shown in the previous figures. Accordingly, while FIG. 4 shows a single symmetric grouping of coils 4, 10, the integrated winding concept, according to an embodiment of the present invention, includes serially winding each symmetric grouping of coils in the superconducting magnet system according to that shown and discussed with regard to FIG. 4. That is, it is contemplated that coils 6, 8 of the second symmetric grouping of magnet coils are wound in a similar manner as coils 4, 10 of the first symmetric grouping of magnet coils as discussed above. Accordingly, if two or more symmetric groupings of coils are present in the system, after each grouping is wound as described above, each grouping is coupled to at least one other grouping via portions 60 and/or 68 such that a closed loop may be formed.

Figure 5:
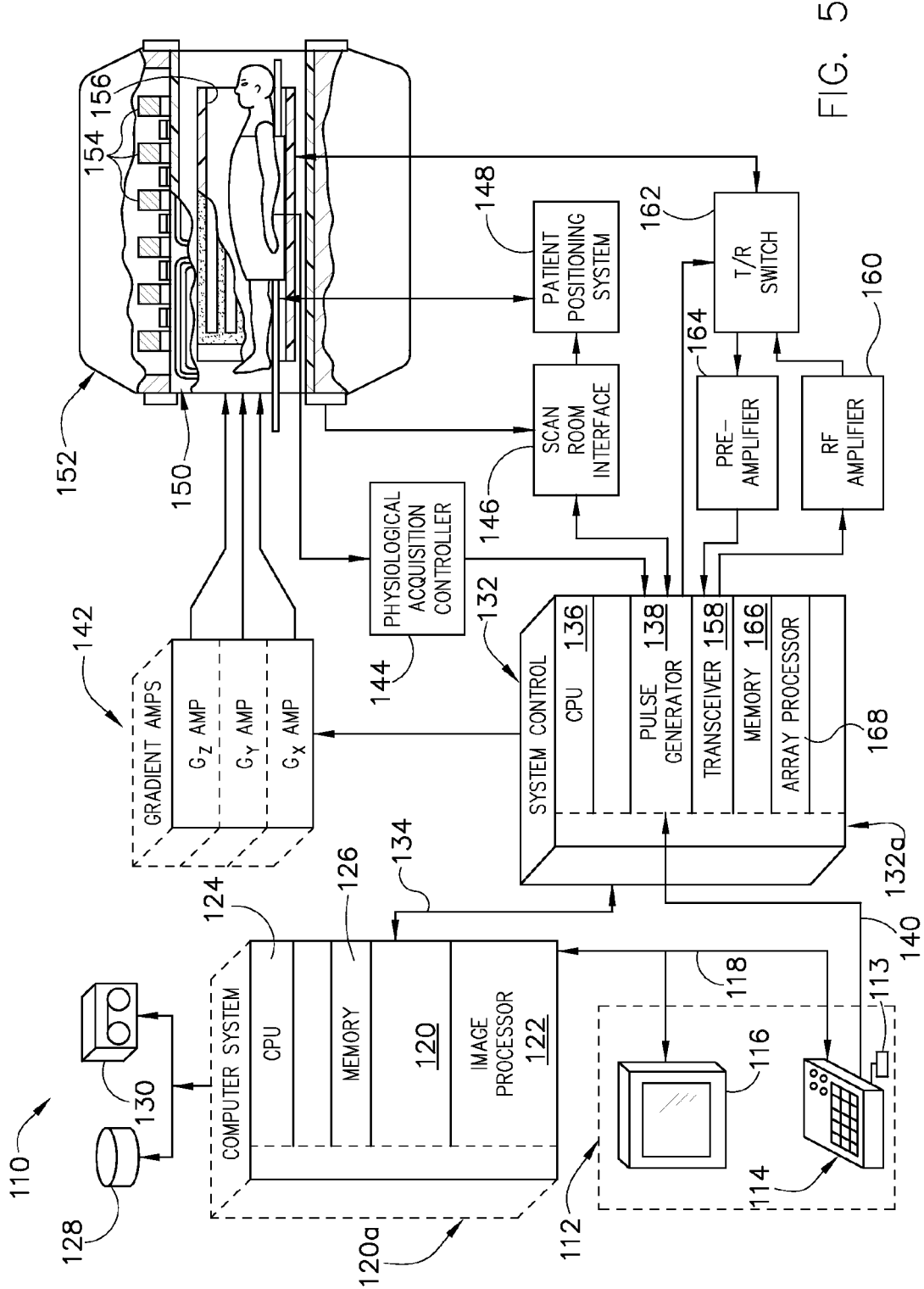
FIG. 5 is a schematic block diagram of an MR imaging system incorporating the present invention.

Referring now to FIG. 5, it is contemplated that the symmetric coil grouping, integrated winding concept, and coil insulation design according to an embodiment of the present invention may be particularly applicable, but not limited to, use in an magnetic resonance imaging (MRI) system 110. The major components of a preferred (MRI) system 110 incorporating the present invention are shown in FIG. 5. The operation of the system is controlled from an operator console 1 which includes a keyboard or other input device 113, a control panel 114, and a display screen 116. The console 112 communicates through a link 118 with a separate computer system 120 that enables an operator to control the production and display of images on the display screen 116. The computer system 120 includes a number of modules which communicate with each other through a backplane 120a. These include an image processor module 122, a CPU module 124 and a memory module 126, known in the art as a frame buffer for storing image data arrays. The computer system 120 is linked to disk storage 128 and tape drive 130 for storage of image data and programs, and communicates with a separate system control 132 through a high speed serial link 134. The input device 113 can include a mouse, joystick, keyboard, track ball, touch activated screen, light wand, voice control, or any similar or equivalent input device, and may be used for interactive geometry prescription.

The system control 132 includes a set of modules connected together by a backplane 132a. These include a CPU module 136 and a pulse generator module 138 which connects to the operator console 112 through a serial link 140. It is through link 140 that the system control 132 receives commands from the operator to indicate the scan sequence that is to be performed. The pulse generator module 138 operates the system components to carry out the desired scan sequence and produces data which indicates the timing, strength and shape of the RF pulses produced, and the timing and length of the data acquisition window. The pulse generator module 138 connects to a set of gradient amplifiers 142, to indicate the timing and shape of the gradient pulses that are produced during the scan. The pulse generator module 138 can also receive patient data from a physiological acquisition controller 144 that receives signals from a number of different sensors connected to the patient, such as ECG signals from electrodes attached to the patient. And finally, the pulse generator module 138 connects to a scan room interface circuit 146 which receives signals from various sensors associated with the condition of the patient and the magnet system. It is also through the scan room interface circuit 46 that a patient positioning system 148 receives commands to move the patient to the desired position for the scan.

The gradient waveforms produced by the pulse generator module 138 are applied to the gradient amplifier system 142 having Gx, Gy, and Gz amplifiers. Each gradient amplifier excites a corresponding physical gradient coil in a gradient coil assembly generally designated 150 to produce the magnetic field gradients used for spatially encoding acquired signals. The gradient coil assembly 150 forms part of a magnet assembly 152 which includes a polarizing magnet 154 and a whole-body RF coil 156. A transceiver module 158 in the system control 132 produces pulses which are amplified by an RF amplifier 160 and coupled to the RF coil 156 by a transmit/receive switch 162. The resulting signals emitted by the excited nuclei in the patient may be sensed by the same RF coil 156 and coupled through the transmit/receive switch 162 to a preamplifier 164. The amplified MR signals are demodulated, filtered, and digitized in the receiver section of the transceiver 158. The transmit/receive switch 62 is controlled by a signal from the pulse generator module 138 to electrically connect the RF amplifier 160 to the coil 156 during the transmit mode and to connect the preamplifier 164 to the coil 156 during the receive mode. The transmit/receive switch 162 can also enable a separate RF coil (for example, a surface coil) to be used in either the transmit or receive mode.

The MR signals picked up by the RF coil 156 are digitized by the transceiver module 158 and transferred to a memory module 166 in the system control 132. A scan is complete when an array of raw k-space data has been acquired in the memory module 166. This raw k-space data is rearranged into separate k-space data arrays for each image to be reconstructed, and each of these is input to an array processor 168 which operates to Fourier transform the data into an array of image data. This image data is conveyed through the serial link 134 to the computer system 120 where it is stored in memory, such as disk storage 128. In response to commands received from the operator console 112, this image data may be archived in long term storage, such as on the tape drive 130, or it may be further processed by the image processor 122 and conveyed to the operator console 112 and presented on the display 116.

Embodiments of the present invention advantageously provide coils that are physically and electrically symmetric to be paired in a magnet circuit, which eliminates or significantly reduces the induced currents in the magnet coils by gradient or other pulses and produces a homogenous field. The integrated winding concept results in an electrically symmetric coil pair, which reduces the accumulated voltages in the coils due to gradient pulsing. Additionally, the insulation layers are added between the coil segments in the integrated winding coils to ensure coil insulation integrity. Embodiments of this invention are particularly useful if the gradient field is not fully shielded.

Therefore, according to an embodiment of the present invention, a superconducting magnet includes a first superconducting magnet coil having a first pair of coil segments and a second superconducting magnet coil having a second pair of coil segments. The coil segments of the first and second pairs of coil segments are serially coupled together in a pattern alternating between the first and second superconducting magnet coils.

In accordance with another embodiment of the present invention, a magnetic resonance imaging (MRI) apparatus includes an MRI system having a plurality of gradient coils positioned about a bore of a superconducting magnet to impress a polarizing magnetic field and an RF transceiver system and an RF switch controlled by a pulse module to transmit RF signals to an RF coil assembly to acquire MR images. The superconducting magnet includes a first superconducting magnet coil with a first coil segment and a third coil segment, and a second superconducting magnet coil with a second and fourth coil segment. The coil segments of the first and second superconducting magnet coils are serially coupled together in a pattern alternating between the first and second superconducting magnet coils.

According to a further embodiment of the present invention, a method of configuring superconducting magnets that includes concentrically positioning a first superconducting magnet coil, having first and third coil segments, on the same axis as a second superconducting magnet coil having second and forth coil segments. Also, the method includes serially coupling the first coil segment to the second coil segment, serially coupling the second coil segment to the third coil segment, serially coupling the third coil segment to the fourth coil segment, and serially coupling the fourth coil segment to one of the first coil segment or a coil segment of another coil.

The present invention has been described in terms of the preferred embodiment, and it is recognized that equivalents, alternatives, and modifications, aside from those expressly stated, are possible and within the scope of the appending claims.

What is claimed is:

1. A superconducting magnet comprising:
   a first superconducting magnet coil having a first pair of coil segments;
   a second superconducting magnet coil having a second pair of coil segments;
   wherein the coil segments of the first and second pairs of coil segments are serially coupled together in a pattern alternating between the coil segments of the first and second superconducting magnet coils.

2. The superconducting magnet of claim 1 wherein the pattern comprises:
   one coil segment of the first pair of coil segments serially coupled between the coil segments of the second pair of coil segments; and
   one coil segment of the second pair of coil segments serially coupled between the coil segments of the first pair of coil segments.

3. The superconducting magnet of claim 1 further comprising:
   a third superconducting magnet coil having a third pair of coil segments;
   a fourth superconducting magnet coil having a fourth pair of coil segments;
   wherein the coil segments of the third and fourth pairs of coil segments are serially coupled together in a pattern alternating between the coil segments of the third and fourth superconducting magnet coils.

4. The superconducting magnet of claim 3 wherein one coil segment of the second pair of coil segments is serially coupled between one coil segment of the first pair of coil segments and one coil segment of the third pair of coil segments.

5. The superconducting magnet of claim 3 wherein the first, second, third and forth superconducting magnet coils are axially aligned;
   wherein the first and second superconducting magnet coils are positioned an equal distance away from a mid-plane axis bisecting a distance therebetween;
   wherein the third and fourth superconducting magnet coils are positioned an equal distance away from the mid-plane axis bisecting a distance therebetween; and
   wherein the distance between the first and second superconducting magnet coils is distinct from the distance between the third and forth superconducting magnet coils.

6. The superconducting magnet of claim 5, further comprising
   a first quench circuit electrically connected in parallel with the first and second pairs of coil segments; and
   a second quench circuit electrically connected in parallel with the third and fourth pairs of coil segments.

7. An MRI apparatus comprising:
   a magnetic resonance imaging (MRI) system having a plurality of gradient coils positioned about a bore of a superconducting magnet to impress a polarizing magnetic field and an RF transceiver system and an RF switch controlled by a pulse module to transmit RF signals to an RF coil assembly to acquire MR images, wherein the superconducting magnet comprises:
      a first superconducting magnet coil, wherein the first superconducting magnet coil comprises a first coil segment and a third coil segment;
      a second superconducting magnet coil, wherein the second superconducting magnet coil comprises a second and fourth coil segment;
      wherein the coil segments of the first and second superconducting magnet coils are serially coupled together in a pattern alternating between the coil segments of the first and second superconducting magnet coils.

8. The MRI apparatus of claim 7 wherein the first magnet coil is positioned on a first side of a mid-plane of the bore;
  wherein the second superconducting magnet coil is positioned on a second side of the mid-plane;
  wherein the second coil segment is serially connected between the first and third coil segments; and
  wherein the third coil segment is serially connected between the second and fourth coil segments.

9. The apparatus of claim 7 wherein the third coil segment is wound about the first coil segment;
  wherein the fourth coil segment is wound about the second coil segment;
  wherein the first superconducting magnet coil further comprises a first electrical insulation layer positioned between the first and third coil segments of the first superconducting magnet coil; and
  wherein the second superconducting magnet coil further comprises a second electrical insulation layer positioned between the second and fourth coil segments of the second superconducting magnet coil.

10. The apparatus of claim 9 wherein the first and second insulation layers comprise a polyimide polymer film.

11. The apparatus of claim 9 further comprising:
  a first pair of electrical insulation layers, the first and third coil segments positioned between the first pair of electrical insulation layers; and
  a second pair of electrical insulation layers, the second and fourth coil segments positioned between the second pair of electrical insulation layers.

12. The apparatus of claim 7 further comprising a resistive shunt coupled in parallel across the first and second superconducting magnet coils.

13. The apparatus of claim 7 wherein the superconducting magnet further comprises:
  a fifth coil segment corresponding to a third superconducting magnet coil positioned on the first side of a mid-plane of the bore;
  a sixth coil segment corresponding to a fourth superconducting magnet coil positioned on the second side of the mid-plane;
  a seventh coil segment corresponding to the third superconducting magnet coil and wound about the fifth coil segment;
  a eighth coil segment corresponding to the fourth superconducting magnet coil and wound about the sixth coil segment;
  wherein the sixth coil segment is serially connected between the fifth and seventh coil segments; and
  wherein the seventh coil segment is serially connected between the sixth and eighth coil segments.

14. The apparatus of claim 13 wherein the fourth coil segment is serially connected to the fifth coil segment.

15. The apparatus of claim 14 further comprising:
  a first resistive shunt coupled in parallel across the first, second, third, and fourth coils segments; and
  a second resistive shunt coupled in parallel across the fifth, sixth, seventh, and eighth coil segments.

16. A method of configuring superconducting magnets comprising the steps of:
  concentrically positioning a first superconducting magnet coil, having a first coil segment and a third coil segment, on a same axis as a second superconducting magnet coil having a second coil segment and a forth coil segment;
  serially coupling the first coil segment to the second coil segment;
  serially coupling the second coil segment to the third coil segment; and
  serially coupling the third coil segment to the fourth coil segment.

17. The method of configuring superconducting magnets of claim 16 further comprising the steps of:
  positioning the first coil segment around a first electrical insulation layer;
  positioning a second electrical insulation layer around the first coil segment;
  positioning the third coil segment around the second electrical insulation layer;
  positioning a third electrical insulation layer around the third coil segment;
  positioning the second coil segment around a fourth electrical insulation layer;
  positioning a fifth electrical insulation layer around the second coil segment;
  positioning the fourth coil segment around the fifth electrical insulation layer;
  positioning a sixth electrical insulation layer around the fourth coil segment.

18. The method of configuring superconducting magnets of claim 16 further comprising the steps of:
  positioning a third superconducting magnet coil, having a fifth coil segment and a seventh coil segment, on the same axis as a fourth superconducting magnet coil having a coil segment sixth and an eighth coil segment;
  serially coupling the fifth coil segment to the sixth coil segment;
  serially coupling the sixth coil segment to the seventh coil segment; and
  serially coupling the seventh coil segment to the eighth coil segment.

19. The method of configuring superconducting magnets of claim 18 further comprising the step of serially connecting the fourth coil segment to the fifth coil segment and serially coupling the eighth coil segment to the first coil segment.

20. The method of configuring superconducting magnets of claim 18 further comprising the steps of:
  coupling a first resistive shunt in parallel across the first, second, third, and fourth coil segments; and
  coupling a second resistive shunt in parallel across the fifth, sixth, seventh, and eighth coil segments.

* * * * *